United States Patent
Kubacki

(10) Patent No.: US 6,416,938 B1
(45) Date of Patent: Jul. 9, 2002

(54) PHOTOSENSITIVE ORGANOSILICON FILMS

(76) Inventor: Ronald M. Kubacki, 3514 Rollingside Dr., San Jose, CA (US) 95148

( * ) Notice: Subject to any disclaimer, the term of this patent is extended or adjusted under 35 U.S.C. 154(b) by 0 days.

(21) Appl. No.: 09/435,396

(22) Filed: Nov. 6, 1999

Related U.S. Application Data

(63) Continuation-in-part of application No. 08/873,513, filed on Jun. 12, 1997, now abandoned
(60) Provisional application No. 60/020,392, filed on Jun. 25, 1996.

(51) Int. Cl.[7] ............................. G03F 7/004; C08J 7/18
(52) U.S. Cl. ..................... 430/323; 430/325; 216/62; 427/489
(58) Field of Search .......................... 430/323, 325; 216/62; 427/489

(56) References Cited

U.S. PATENT DOCUMENTS

| | | | | |
|---|---|---|---|---|
| 4,560,641 A | * | 12/1985 | Kukaku et al. ............. | 430/312 |
| 4,851,256 A | * | 7/1989 | Matsuyama et al. .......... | 427/39 |
| 4,880,687 A | * | 11/1989 | Yokoyama et al. ......... | 428/141 |
| 4,921,321 A | * | 5/1990 | Weidman .................. | 350/96.12 |
| 6,013,418 A | * | 1/2000 | Ma ............................ | 430/323 |

* cited by examiner

Primary Examiner—Mark F. Huff
Assistant Examiner—Nicole Barreca

(57) ABSTRACT

A process for making a two-component plasma-deposited photo-oxidizable organosilicon film on a substrate from a silicon donor and an organic precursor. Subjecting selected areas of the film to photo-oxidation allows selective etching of the non-photo-oxidized or photo-oxidized areas of the film. The process is used as a resist for patterning substrates in the fabrication of solid-state devices. It is of particular use in patterning heat sensitive substrates and accomplishing microlithography in a closed chamber process at other than atmospheric pressure. The process allows photo-oxidation with ultraviolet light at wavelengths closer to visible light than that for conventional photoresists. The processed film exhibits selective wetting properties between the non-photo-oxidized and photo-oxidized areas of the film.

17 Claims, No Drawings

PHOTOSENSITIVE ORGANOSILICON FILMS

CROSS REFERENCES TO PRIOR APPLICATIONS

This application is a continuation-in-part of U.S. application Ser. No. 08/873,513, filed Jun. 12, 1997, now abandoned, which claims the benefit of U.S. Provisional Application No. 60/020,392, filed Jun. 25, 1996.

BACKGROUND OF THE INVENTION

1. Technical Field

The invention relates generally to the formation of photosensitive organosilicon films by plasma-initiated polymerization utilizing direct application of electrical energy, and more particularly, to the formation of photosensitive films from a silicon donor and an organic precursor for use in the fabrication of solid-state devices and other film applications.

2. Background Art

An integrated circuit is a three-dimensional structure of alternating patterned layers of conductors, dielectrics and semiconductor films. The patterned layers are formed by lithographic processes that consist of two steps: delineation of the patterns in a radiation sensitive material, usually a polymer; and transfer of the patterns into underlying, previously deposited thin films, using an appropriate etching technique.

Conventional photolithography (that is, photolithography employing light at 350 to 450 nm wavelength) is used to fabricate solid-state devices with features of 6 µm or smaller. Incremental improvements have allowed the use of light in the range of 350 to 450 nm wavelength to produce ever smaller features. However, the ultimate resolution of a printing technique is governed, at the extreme, by the wavelength of the light, or radiation, used to form the image, with shorter wavelengths yielding higher resolution. The same physical principles also govern the resolution limits in microscopy. Additionally, the same basic positive photoresist, consisting of a photoactive compound that belongs to the diazonaphthoquinone chemical family and a novolac resin, has been in pervasive use since the mid-nineteen seventies, and will likely be the resist of choice for several more years. The manufacturing facility has also been driven to cleaner specifications due to the smaller geometries of the parts being produced. The cost of introducing a new photolithographic technology, which includes the cost associated with the development and implementation of new hardware and resist materials, is a strong force pushing refinement of current photolithographic processes and conventional clean room design instead of pursuing revolutionary techniques. The technological alternatives to conventional photolithography are largely the same as they were a decade ago: short wavelengths of light (220 to 280 nm), the so-called deep ultraviolet range photolithography; scanning or projection electron beam; and x-ray or scanning ion beam lithography.

Unfortunately, conventional resists are not appropriate for use with the new lithographic technologies that are necessary for producing line widths under 0.5 µm. The most notable deficiencies of the conventional novolac-quinonediazide resists are their sensitivity and absorption characteristics. Additionally, the absorption of conventional photoresists is too high to allow uniform imaging through practical resist film thicknesses (approximately equal to 1 µm). Thus, no matter which technology becomes dominant after photolithography has reached its resolution limit (that is, 0.3 to 0.5 µm), new resists and processes will be required, necessitating enormous investments in research and process development. The introduction of new resist materials and processes will also require a considerable lead time to bring them to the performance level currently realized by conventional positive photoresists. Clearly, conventional wet chemistry photoresists have limited applicability for the future of solid-state device fabrication. Liquid resist chemicals are very difficult to obtain in a pure state and are expensive. The process of applying a wet resist does not lend itself to large or odd shaped substrates, and the required baking step makes this process unsuitable for temperature sensitive substrates.

Consequently, there are advantages to a photoresist which is easily applied and processed in a vacuum chamber or series of enclosed chambers with no requirement for being brought to atmosphere. Such a photoresist permits the elimination of wet chemistry processes, and consequently, provides substantial benefits in the reduction of costs and generation of hazardous wastes. Furthermore, it eliminates the exposure of operators to the hazardous liquids and vapors generated by the conventional resist process. Finally, the dry plasma deposited photoresist allows the further development of integrated manufacturing modules without the necessity of clean rooms.

To address the above limitations, I took an approach that is considerably different from any of the prior art. In my invention, I produce a plasma-deposited photo-oxidizable organosilicon film that can be used as a photoresist from a silicon donor and an organic precursor.

Despite intensive research on the plasma deposition of amorphous silicon from monosilane ($SiH_4$), there have been only a few reports exploring the formation of Si—Si bonded polymers from monosubstituted organosilanes. Haller reported an example of selective dehydrogenative polymerization, but no photochemical studies were described. See Haller, *Journal of the Electrochemical Society A*, Vol. 129, 1987, p. 180, and Inagaki and Hirao, *Journal of Polymer Science A*, Vol. 24, 1986, p. 595. Studies on the plasma chemistry of methylsilane ($MeSiH_3$) have involved higher radio-frequency powers and temperatures which promote formation of amorphous silicon carbide (SiC) rather than reactive polymeric product. See Delpancke, Powers, Vandertop and Somorjai, *Thin Solid Films*, Vol. 202, 1991, p. 289. Low power plasma polymerization of tetramethylsilane and related precursors has been proposed to result in the formation of Si—C—Si linkages. See Wrobel and Wertheimer, *Plasma Deposition, Treatment and Etching of Polymers*, Academic Press, New York, Chapter 3. Such materials lack sufficient absorption in light above approximately 225 nm wavelength, but have been studied as far ultraviolet (193 nm wavelength) resists by Horn and associates. See Horn, Pang and Rothschild, *Journal of Vacuum Science Technology B*, Vol. 8, 1991, p. 1493. Polymer chemistry teaches the use of the basic silanes are insignificant as a monomer for polymerization type of polymer. Furthermore, polysiloxanes are differentiated from the basic silanes, and contrasted as being very important in terms of monomers for polymerization. See Stevens, Malcom P., *Polymer Chemistry, An Introduction*, Addison-Wesley Publishing Co., 1975: p. 334. As used here, I define polymerization to be the process whereby monomers are bound together forming various length chains but essentially repeating the basic building block of the monomer without significant chemical or physical alteration of the beginning monomer. Work has been reported on the synthesis of soluble poly-alkylsilyne network polymers ($[SiR]_n$) which exhibit intense ultraviolet absorption (associated with extended Si—Si bonding) and may be photo-oxidatively patterned to give stable siloxane networks. See Bianconi and Weidman, *Journal of the American Chemical Society*, Vol. 110, 1988, p. 2341. Dry development is accomplished by selective anisotropic removal of unexposed material by chlorine or hydrobromic acid reactive ion etching. See Hornak, Weidman and Kwock, *Journal of Applied Physics*, Vol. 67,1990, p. 2235, and Horn, Pang and Rothschild, *Journal of Vacuum Science Technology B*, Vol. 8, 1991, p. 1493. The exposed, oxidized material may be removed by either wet or dry fluorine based chemistry. Kunz and associates have shown that this makes polysilynes particularly effective as 193 nm wavelength photoresists. See Kunz, Bianconi, Horn, Paladugu, Shaver, Smith, and Freed, *Proceedings of the Society of Photo-optical and Instrumentation Engineers*, Vol. 218, 1991, p.1466. The high absorbability and the wavelength limits photo-oxidation to the surface, eliminating reflection, and the pattern is transferred through the remainder of the film during the reactive ion etch (RIE) development. Studies of organosilicon hydride network materials containing reactive R—Si—H moieties have found that such high silicon compositions as $[MeSiH_{0.5}]_n$ exhibit superior photosensitivity and function as single layer photodefinable glass etch masks. See Weidman and Joshi, *New Photodefinable Glass Etch Masks for Entirely Dry Photolithography: Plasma Deposited Organosilicon Hydride Polymers*, Applied Physics Letters, Vol. 62, No. 4, 1993, p. 372. However, cost and availability of the exotic organosilicon feedstocks have significantly inhibited the transfer of such photosensitive organosilicon hydride network materials into microcircuit fabrication. Further, films deposited from single component organosilicon feedstocks possess limited latitude in alteration of deposited film characteristics, such as the radiation frequency of photosensitivity and selectivity during etch processes.

Organosilicons have been used to produce various types of films, as disclosed by the following references.

| U.S. Pat. No. | Name | Date |
| --- | --- | --- |
| 4,493,855 | Sachdev et al. | 01-85 |
| 4,532,150 | Endo, et al. | 07-85 |
| 4,868,096 | Nakayama et al. | 09-89 |
| 5,294,464 | Geisler et al. | 03-94 |

Sachdev et al. teaches the deposition of an organosilicon film by plasma polymerizations. However, the deposited film is not itself photosensitive. Sachdev et al. uses the film as a barrier and uses a conventional spun-on resist to pattern it. Sachdev et al. does not teach the use of a plasma-deposited film as a photoresist; a conventional photoresist is used to pattern the plasma-deposited film, which is then used as an etch mask. Endo et al. describes the plasma deposition of a silicon carbide layer. A single organosilicon gas that may react with other materials is used to deposit a durable silicon carbide type of film. Furthermore, Endo et al. does not teach film photosensitivity. Nakayama et al. discloses the use of an oxygen plasma to modify a silicon surface to allow a conventional photoresist to adhere to the material. The conventional photoresist is then used to pattern the silicon layer. A photosensitive organosilicon film is not deposited. There is no plasma depositing of a film; the oxygen plasma is used to modify the surface structure which is followed with conventional techniques for patterning the silicon film. Geisler et al. describes a method of plasma-coating a plastic substrate using organosiloxanes and an inert gas to facilitate adhesion of a reflective layer of a metal with minimal surface damage to the substrate. None of these references teach the use of photosensitive plasma polymerized organosilicon films produced from a silicon donor and organic precursor.

While the above background is directed to the use of my invention as photoresists for solid-state devices, there are properties of the resulting photo-oxidizable organosilicon films that make them useful in allied fields, such as flat panel displays, wetting agents and other applications that can make use of a photo-oxidizable film product either with the radiation induced photo-oxidized film being left on the substrate or being selectively etched as a final or intermediate process step.

SUMMARY OF THE INVENTION

Accordingly, it is a primary object of the present invention to provide a process for forming a photo-oxidizable organosilicon film product from inexpensive and readily available components consisting of a silicon donor and an organic precursor, without the expense and limitations of single component organosilicon feedstocks.

It is a further object of the present invention to provide a dry, versatile and inexpensive process for forming a plasma-deposited photoresist film on a substrate for use in the fabrication of solid-state devices. The process does not require elevated temperatures and can be used for the fabrication of solid-state devices with heat sensitive substrates.

Another object of the present invention is to provide a dry process for: (1) selectively patterning a plasma-deposited photoresist film on a substrate by photo-oxidizing selected areas of the film; (2) selectively etching away either the photo-oxidized or non-photo-oxidized areas of the film; (3) performing production processes, such as etching of the substrate, diffusion of a material into the substrate, and transfer of a pattern from a mask to the resist, and then to the substrate, as commonly done in the fabrication of solid-state devices; and (4) removing either the non-photo-oxidized or photo-oxidized areas of the film that were not removed in step (2). The etch rate difference (etching selectivity) between the photo-oxidized and the non-photo-oxidized areas allows the film to be used as a resist for generating either positive or negative images depending on the etch chemistry process. The process allows for the performance of all microlithography steps in a suitably equipped enclosed chamber or series of chambers. Furthermore, the process allows greater latitude in the wavelength of light required to photo-oxidize the resist film making it attractive for large and small feature sizes.

Still another object of the present invention is to provide a process for forming a plasma-deposited photosensitive organosilicon polymer film on a substrate that has selective wetting properties. When selected areas of the film are photo-oxidized, a wetting solution adheres only to the photo-oxidized areas. The process is useful for selective plating of films.

Additional objects, advantages and other useful features of the invention will become apparent to those skilled in this art from the following description, wherein I have shown and described a preferred embodiment of this invention, simply by way of illustration of one of the modes best suited to carrying out the invention. As will be realized, the invention is capable of other and different embodiments, and its several details are capable of modifications in various, obvious aspects, all without departing from the invention. Accordingly, the description is to be regarded as illustrative in nature, and not restrictive. The objects and advantages of the invention may be realized and attained by means of the processes particularly pointed out and claimed in the appended claims.

BEST MODE FOR CARRYING OUT THE INVENTION

Deposition of PDPP Film Using Silicon Donors and Organic Precursors

As I practice my invention, plasma-deposited photosensitive polymer (PDPP) films are produced by flowing a silicon donor and an organic precursor into an evacuated plasma chamber, wherein the donors react and deposit a PDPP film on a substrate in the chamber. Any plasma chamber with the following characteristics would be suitable for the development of these films:

(1) hardware for evacuating the chamber to eliminate the presence of oxygen;
(2) electrodes supplied with electrical energy to sustain the plasma;
(3) hardware for flowing the silicon donor and organic precursor through the plasma chamber at controlled flow pressures; and
(4) hardware for holding the substrate in position in the plasma chamber.

For the deposition of these particular films, a Model DSN Room Temperature Plasma Deposition System, which is available from Ionic Systems (San Jose, Calif.), was used. This plasma chamber is substantially as disclosed in U.S. Pat. No. 4,262,631, with modifications noted herein. The plasma chamber was equipped with dual power supplies of 2,500 W and 1,000 W that operated at 13.56 MHz. The plasma chamber was vacuum pumped with an Edwards High Vacuum International (Wilmington, Mass.) Model E2M-80 direct drive rotary vane pump. Flow pressures were monitored with an M K S Instruments, Inc. (Andover, Mass.) Series 220 BARATRON.

The materials used as silicon donor and organic precursor must be in a gaseous or vapor state to achieve flow through the plasma chamber. Selection of materials for the silicon donor and organic precursor will be dependent upon the desired characteristics of the PDPP film, the cost of the materials, and how well-behaved the materials are in the processing environment.

The material used as a silicon donor is a substantially non-carbon containing and non-oxygenated silicon compound. Silicon hydrides are preferred since they provide more silicon, which enhances the use of the PDPP film as a resist in the fabrication of solid-state devices and other film product applications. In the preferred embodiments of my invention, monosilane ($SiH_4$) is used as the silicon donor. Other suitable source materials for silicon donors include disilane ($Si_2H_6$) and dichlorosilane ($SiH_2Cl_2$).

The material used as an organic precursor is a substantially non-silicon containing and non-oxygenated organic compound. In the preferred embodiments, ethylene ($C_2H_4$), methane ($CH_4$) and ethane ($C_2H_6$) are used as gaseous organic precursors, and toluene ($C_6H_5CH_3$) is used as a liquid vapor donor. Other suitable sources for organic precursors broadly include organic compounds such as alkanes, alkenes, alkynes, phenyls and aromatic hydrocarbons. Selective organic compounds may be blended to achieve an optimum organic precursor for a desired PDPP filming process.

As evident from the following embodiments of my invention, I have found that film formed from a separate silicon donor and organic precursor can lead to a film product that is more easily produced and controlled in its content than film product from a single organosilicon feedstock.

In the preferred embodiments, monosilane is used as the silicon donor, and ethylene gas or toluene vapor are used as organic precursors to deposit the PDPP film. Flow rates of monosilane have been used in the range of 20 to 200 scc/min (preferably 25 to 35 scc/min), and organic precursors flowed at 100 to 300 scc/min (preferably 140 to 180 scc/min). Pressure in the plasma chamber has been allowed to build to 150 to 500 mtorr (preferably in the range of 180 to 300 mtorr). Power for deposition of the film has been applied in densities from 0.8 to 15 mW/cc, with the optimum range being 8 to 10 mW/cc at 13.56 MHz. These operating parameters will be understood by those skilled in the art as typical operating conditions, and not limiting the scope of my invention. The monosilane used was Semiconductor Grade Silane ($SiH_4$), which is available from Liquid Carbonic Industries Corp. (Oak Brook, Ill.). Organic precursors were 99.9% pure ethylene, supplied by Liquid Carbonic Industries Corp., or ACS Certified Class 1B toluene, supplied by Fisher Chemicals (Fair Lawn, N.J.).

Selected organic precursor materials must have sufficient vapor pressure, with or without heating, to allow their introduction into the plasma chamber. This includes a variety of materials that can be either a gas or liquid at standard temperature and pressure (STP). In most cases, the exposure of a liquid organic precursor in a containment vessel to the vacuum system will generate sufficient vapor flow to allow many liquids, as well as gases, to be used with no operator exposure. If sufficient vapor pressure is not attained, the liquid donor may be heated slightly to increase its vapor pressure. For the processing of the films in the preferred embodiments of my invention, one gas at STP, ethylene, or one liquid at STP, toluene, are used as organic precursors. Toluene was selected due to its favorable vapor pressure, as well as its ultraviolet transmission characteristics. Neither the silicon donor nor the organic precursor can contain an appreciable amount of oxygen, since oxygen with ultraviolet exposure from the plasma during the deposition process would cause photo-oxidation of the silicon and degrade the photosensitivity of the deposited film.

A silicon donor that is substantially non-carbon and non-oxygen containing inhibits the polymerization of the silicon donor with the organic precursor during the plasma reaction. This promotes the encasing of plasma-generated modified forms of the silicon donor that include (Si—H) and (Si—Si) low molecular weight fragments within an organic polymer matrix formed substantially from plasma-polymerization of the organic precursor. Therefore, photo-oxidation is achieved primarily by the oxidation of the silicon within the interstitially situated modified forms of the silicon donor when the film is subjected to radiated electromagnetic energy.

For the monosilane/ethylene film depositions, ethylene was supplied to an inlet port on the plasma chamber and controlled with a manual flow valve. A vessel was used for the containment of liquid toluene for the monosilane/toluene film depositions. The liquid nature of toluene at STP required the development of a method for the introduction of toluene vapors to the plasma chamber. A sample cylinder was obtained and thoroughly cleaned for the toluene introduction. After cleaning and drying, the cylinder was attached to the deposition system and evacuated to less that 10 mtorr.

At this point, the valve on the sample cylinder was closed and the cylinder removed from the system. A clean stainless steel tube was attached to the sample cylinder. The tube was submerged in a vessel of reagent grade toluene and the shut-off valve was opened. The vacuum inside the sample cylinder was used to draw the toluene into the sample cylinder while introducing as little trapped gas as possible. After installation on the vacuum system, the shut-off valve was opened and the toluene was allowed to degas for fifteen minutes before any plasma processing was attempted. Seasoning runs were performed for one hour before actual depositions were performed for the photosensitive films.

A water bath was installed on the liquid toluene vapor source to assist in keeping a constant vapor pressure during the depositions. No heating was used in the bath, but the temperature held at 23° C.±1° C. during depositions. Pressure during depositions held constant within ±5 mtorr. The effect of the evaporative cooling was minimal on the vapor pressure and flow of the liquid toluene donor. Flow from the vessel was controlled with a manually adjusted valve on the top of the containment vessel. Initially, no attempt was made to either heat or hold the liquid vessel isothermal to reduce evaporative cooling, which would have an impact on the ability to maintain constant flow. However, pressure during deposition was constantly monitored to determine if the flow of the toluene was dropping.

Initial depositions of the PDPP films were performed with the plasma chamber's depositor under manual control to easily vary and control deposition conditions. A monosilane flow rate of 50 scc/min was used to establish a plasma chamber pressure with the monosilane, and then varying amounts of organic precursors were flowed to achieve the desired pressure increases. The ratio of the pressure of the organic precursor to the pressure of the monosilane was used for monitoring during the screening. Weight ratios of organic precursor to monosilane of less than 1:4 and greater than 2.5:1 resulted in films of negligible photosensitivity. For useful depositions, weight ratios of organic precursor to monosilane of 1:2 and 1:1 were chosen. In addition, for deposition, input power to the plasma chamber was varied between 200 W and 400 W. I have successfully deposited PDPP films on a variety of organic and inorganic substrates with the disclosed process. Magnetic substrates, either as a top deposition layer or other layer in the composite substrate, are not a preferred application since the magnetic field produced by the material, even if it is not the contact layer for the film, has the potential of interfering with the structure of the film during the plasma polymerization process and thereby can influence the photosensitivity throughout the thickness of the film.

It is preferable to separately flow the silicon donor and organic precursor into the plasma chamber to enhance substantial uniformity of the plasma-modified silicon donors within the resulting organic polymer matrix and prevent possible spontaneous pre-reactions. As understood by those skilled in the art, silicon donors and organic precursors can be premixed in a variety of ratios to insure uniform component distribution, and reduce the cost and complexity of the piping and associated hardware for gas introduction into the plasma chamber. Donors and precursors can also be premixed or mixed in a manifold. Premixing of the silicon donor and organic precursor is acceptable but may require stricter process control to achieve a substantially uniform distribution within the film. Hydrogen or an inert gas may be added to increase uniformity due to its higher mobility.

As understood by those skilled in the art, a variety of deposition systems may be used that operate at a wide variety of power levels and types, including radio frequency range (approximately 40 kHz) through microwave, and electron cyclotron resonance systems operating in excess of 2 GHz. In the preferred embodiments, there is no substrate heating involved, but the substrate can be heated or cooled during the deposition process to enhance the properties of the deposited films. A wide variety of pressures, from ultrahigh vacuum (less than $10^{-7}$ torr) up to and exceeding atmospheric pressure can be used. In the preferred plasma chamber, the substrate floats electrically, but it can be grounded or powered.

PDPP Film Resist in the Fabrication of Solid-State Devices

Since one of my objectives was to provide a resist material from silicon donors and organic precursors for use in the lithographic processes for fabrication of solid-state devices, I experimented with the photosensitivity and etching characteristics of the PDPP films that I had produced by the above processes.

Samples of the PDPP films that were prepared by the above processes were exposed to ultraviolet radiation in the presence of oxygen from the air. Exposures were performed at low resolution using UVP, Inc. (Upland, Calif.) Model No. UVG-54 ultraviolet source for use at 254 nm wavelength. Exposures at 365 nm wavelength were made using the same lamp housing with a UVP, Inc. Model No. 34-0034-01 ultraviolet source for use at 365 nm wavelength. Various masks were used for contact type imaging. While further processing of the photosensitive film by selective etching as described below can be performed, the selectively photo-oxidized film product without selective etching can be used in applications such as selective wetting to exploit the differing adhesion characteristics between the photo-oxidized and non-photo-oxidized areas of the film product.

Developing was performed in a 10:1 Buffered Oxide Etch (10:1 BOE) supplied by Ashland Chemical Company (Columbus, Ohio). A composition for this 10:1 Buffered Oxide Etch can be found in Ashland Chemical Company's Material Safety Data Sheet No. 308.0034306-005.004I, which defines the ingredients of the 10:1 BOE in percent by weight as: water (57.0–61.0%); ammonium fluoride (34.0–38.0%); and hydrofluoric acid (4.7%). Film thicknesses were determined profilometrically with a Sloan Technology Corp. (Santa Barbara, Calif.) Dektak 1 and Nanometrics Inc. (Kanata, ON, Canada) Model 216S.

Photosensitivities were first observed after exposure to 254 nm wavelength deep ultraviolet with a simple contact mask. Development took place in 10:1 BOE to establish that there was conversion of the plasma-deposited photosensitive polymer (PDPP) to glass-like plasma-deposited photosensitive polymer (GLPDPP), and to establish etch rates.

The films deposited by the above disclosed processes had thicknesses of 0.08 to 0.15 $\mu$m of PDPP. Development was performed in 10:1 BOE. Except as noted in Table 1, there was selectivity exhibited between PDPP and GLPDPP, and the GLPDPP was entirely removed from the silicon substrate as indicated by profilometry.

TABLE 1

Data for PDPP Deposition, Photo-oxidation and Etching

| Sample Number | Organic Precursor | Partial Pressure of the Organic Precursor Relative to Silane (%) | Power (W) | Deposition Rate (Å/sec) | Resultant Compressive Stress in Film (Dynes/cm$^2$) | BOE Etch Rate (Å/min) | Selectivity (GLPDPP:PDPP) |
|---|---|---|---|---|---|---|---|
| 1 | Ethylene | 50 | 400 | 0.82 | 2.7 × 10$^8$ | 140 | Not Detected |
| 2 | Ethylene | 50 | 200 | 0.71 | 8.3 × 10$^7$ | 210 | Not Detected |
| 3 | Ethylene | 100 | 400 | 0.91 | 4.7 × 10$^8$ | 185 | Not Detected |
| 4 | Ethylene | 100 | 200 | 0.72 | 0.8 × 10$^8$ | 320 | >25:1 |
| 5 | Toluene | 50 | 400 | 0.85 | 3.3 × 10$^8$ | 300 | >25:1 |
| 6 | Toluene | 50 | 200 | 0.83 | 7.6 × 10$^7$ | 330 | >25:1 |
| 7 | Toluene | 100 | 400 | 0.88 | 2.1 × 10$^8$ | 285 | >25:1 |
| 8 | Toluene | 100 | 200 | 0.88 | 9.8 × 10$^7$ | 270 | >25:1 |

For the results in Table 1, the monosilane flow rate for all depositions was 50.0 scc/min and the pressure from monosilane flow was 68 to 70 mtorr. Stress measurements were made on bare 1,0,0 silicon wafers. All exposures were made with light at 248 nm wavelength for exposure dosage of 600 mj/sq-cm. Deposited film thickness was 1500 Å. Etch rates are for a 10:1 buffered oxide etch and are for the exposed (GLPDPP) area. Samples were monitored visually every minute during etching to determine etch rate. Samples with greater than 25:1 selectivity (GLPDPP:PDPP etching selectivity) exhibited no PDPP etching from the 10:1 BOE, and actually increased slightly in thickness due to swelling.

For Sample Numbers 1, 2 and 3 in Table 1, the etch selectivity is poor. The etch would not fully clear oxidized areas, and unexposed areas were etching away almost as quickly as the exposed areas. For these samples, a combination of the deposition conditions, exposure conditions, and etchant used resulted in generally unsuitable structures. For samples with good selectivity, the film fully converted to GLPDPP.

The use of the 10:1 BOE provides a benchmark for the etchability of the exposed material and further demonstrates that the exposed GLPDPP acts like a silicon oxide type material, while the unexposed PDPP was not affected by the 10:1 BOE, as is consistent with a silicon hydride network.

I have shown that my PDPP film processing can be used to selectively etch the GLPDPP that is formed after photo-oxidation of the PDPP film. In order to be of use as a resist in the fabrication of solid-state devices and other film product applications that can make use of the selective etching characteristics of the film, it must also be possible to selectively etch the unexposed PDPP film. I conducted tests to determine if a simple chlorine based dry etch was capable of removing the unexposed PDPP and leaving the exposed GLPDPP material. Operating conditions for the Zylin etching machine are identified in Table 2. Etching was performed with chlorine plasma dry etching, available from Liquid Carbonic Industries Corp. (Oak Brook, Ill.). Results of the tests are listed in Table 3. Film thicknesses were obtained using a Nanometrics (Kanata, ON, Canada) NANOSTEP. The apparent slight increase in film thickness after etching the unexposed areas is due to normal instrumental error. As can be seen by the results in Table 3, the selectivity in chlorine etch for unexposed PDPP to exposed GLPDPP is greater than 15 to 1.

TABLE 2

Operating Conditions for Chlorine Etching

| Parameter | Setting |
|---|---|
| Chamber Pressure | 100 mtorr |
| RF Power | 150 W |
| DC Bias | 150 V |
| Chlorine Flow Rate | 50 scc/min |
| Electrode Temperature | 40° C. |

TABLE 3

Results of Chlorine Etching for PDPP/GLPDPP Film

| Sample Number | Exposed Photo-sensitive Polymer (GLPDPP) | Unexposed Photo-sensitive Polymer (PDPP) | Film Thickness Before Etch (Å) | Film Thickness After Etch (Å) | Etch Rate (Å/min) |
|---|---|---|---|---|---|
| 1 | GLPDPP | — | 1712 | 1361 | 351 |
| 1 | — | PDPP | 1825 | 1836 | 0 |
| 2 | GLPDPP | — | 1724 | 1406 | 318 |
| 2 | — | PDPP | 1865 | 1871 | 0 |
| 3 | GLPDPP | — | 1699 | 1327 | 372 |
| 3 | — | PDPP | 1812 | 1819 | 0 |

The above photo-oxidation and selective etching processes show how my PDPP film depositions from separate silicon and organic precursors can be used as a resist material in the fabrication process for solid-state devices. Table 4 illustrates achieved etching selectivites between unexposed PDPP and exposed GLPDPP with various etching processes.

TABLE 4

Selective Etching of PDPP and GLPDPP Material

| Material Etched | Material Not Etched | Etch Selectivity (Material Etched: Material Not Etched) | Etching Process |
|---|---|---|---|
| GLPDPP | PDPP | >50:1 | 10:1 Buffered Oxide |
| GLPDPP | PDPP | >15:1 | Fluorine Reactive Ion |
| PDPP | GLPDPP | >50:1 | Chlorine Reactive Ion |

Photo-oxidation as used in this specification is generally understood to be accomplished by the exposure of a material to radiated electromagnetic energy in the presence of oxygen in air. Generally, light energy is used, and more specifically, light in the ultraviolet end of the visible electromagnetic spectrum, typically recognized as from 200 nm to 400 nm is used. It will be understood by those skilled in the art that other forms of radiant energy, above visible light in the electromagnetic spectrum, such as x-rays, or gamma or alpha radiation, may be used. Furthermore, since oxygen in the air is the agent for oxidation, other concentrations of oxygen can be used.

In the fabrication of a solid-state device, whether it is a microprocessor, memory chip, liquid crystal display, pressure sensor, transistor, capacitor, resistor, and so forth, the production sequences include the patterning of numerous substrate materials. Patterning is typically done by masking a substrate covered by a film of resist and exposing the resist to radiated electromagnetic energy, typically ultraviolet light, through the mask. The mask permits only selected areas of the resist to be exposed to the ultraviolet light. Then, either the exposed or unexposed resist is selectively etched away in a process knows as developing. One or more production processes, known to those skilled in the art (see, e.g., *Semiconductor and Integrated Circuit Fabrication Techniques*, Gise, Peter, and Blanchard, Richard, Fairchild Corporation, Reston Publishing Company, Reston, Va., 1979), such as: etching of the substrate; pattern or image transfer from the mask to the resist, and then to the substrate; diffusion of a material into a substrate layer; ion implanting in a substrate layer; pigment injection or dyeing of a substrate layer, is then performed. Subsequently, the remaining resist is removed, and the process is repeated as required to fabricate the device. The art of microlithography with conventional chemistries is well known in the art. For a typical silicon based integrated circuit, a silicon dioxide film, or substrate, is grown on a silicon wafer to act as an insulator. Using my disclosed filming process, a PDPP film is deposited on the silicon dioxide. I pattern the areas of the silicon dioxide that I wish to remove for implant of material into the silicon. I expose the PDPP to ultraviolet light through a mask which delineates my required patterning. Using a fluorine reactive ion etch, I etch away the GLPDPP produced by exposing the PDPP to ultraviolet light through the mask in the presence of oxygen, and I also perform the production process of etching away the silicon dioxide. As indicated in Table 5, the fluorine reactive ion etch will etch silicon dioxide at a rate 30 times as great as it will etch PDPP. I then remove the PDPP and implant selected material into the silicon wafer through the patterned silicon dioxide substrate. This process of substrate layering, patterning, and performing production processes is repeated as required to fabricate each circuit device, as well known in the art with conventional chemistries. Both silicon and silicon oxide can be selectively patterned with the PDPP and GLPDPP as shown in Table 5. Finally, interconnection of the individual circuit devices can be done with a metal, usually aluminum. Patterning of the aluminum can also be done with my PDPP/GLPDPP process. A layer of silicon nitride is placed over the top of the fabricated device for protection. My PDPP/GLPDPP process is also used to pattern the silicon nitride to expose the aluminum pads for external circuit connections. The described fabrication process is typical whether the device is a simple discrete transistor, a microprocessor, dynamic random access memory device, or the driver transistors for a liquid crystal display. In general alternating layers, or substrates, of semiconductors, insulators and conductors are deposited and patterned to form the required solid-state device.

TABLE 5

Selective Etching for Pattern Transfers Using PDPP and GLPDPP Masks

| Material Etched | Mask Material Not Etched | Etch Selectivity (Material Etched:Mask Material Not Etched) | Etching Process |
|---|---|---|---|
| $SiO_2$ | PDPP | >30:1 | Fluorine Reactive Ion |
| $SiO_2$ | PDPP | >30:1 | 10:1 Buffered Oxide |
| Si | PDPP | >50:1 | Fluorine Reactive Ion |
| HgCdTe | GLPDPP | 10:1 | $Ar/H/CH_4$ Electron Cyclotron Resonant |

PDPP Film Resist in the Fabrication of Solid-State Devices in an Enclosed Chamber Fabrication of solid-state devices using a conventional, wet photoresist process involves repeated applications of the following procedures:

(1) Wet resist is applied to a substrate. This process can not be done in a vacuum chamber and generates hazardous fumes and toxic liquid waste.

(2) The resist is masked and exposed to light in the presence of air.

(3) The resist is developed. This process can not be done in a vacuum chamber and generates toxic liquid wastes.

(4) (4) The resist is baked at least once. This process generates hazardous fumes.

(5) A masked pattern is etched in the resist.

(6) Production processes are performed.

(7) The remaining resist is removed.

My disclosed process involves the following procedures:

(1) A PDPP film is deposited on a substrate.

(2) Selected masked areas of the PDPP film are photo-oxidized by exposure to ultraviolet light or other forms of suitable radiated electromagnetic energy in the presence of air. This is alternatively accomplished by flowing oxygen in varying concentrations and pressures into an enclosed chamber at pressures significantly reduced from atmospheric, which could be the deposition vacuum chamber with oxygen flowing through it, or removing the substrate from the chamber for masking.

(3) The PDPP is developed by etching away either the photo-oxidized areas or the non-photo-oxidized areas.

(4) Production processes are performed.

(5) The remaining non-photo-oxidized or photo-oxidized areas of PDPP film not etched away in step (3) are removed.

All of my procedures can be done in a suitably equipped enclosed chamber or series of chambers. In the manufacture of a solid-state device, it is preferred to have fabrication processes performed in a closed chamber to maintain cleanliness. A vacuum is particularly clean which is why it is preferred to just a sealed environment except for the step of photo-oxidation. Total processing in the chamber eliminates the possibility of material degradation that can be caused by contamination or surface reactions. Such material degradation can significantly impact the quality of a solid-state device. The only process that can not be done in a closed chamber with conventional processes is the application and developing of the photoresist. These processes must be done at atmosphere. It is an organic liquid that can not be applied or exposed under vacuum or at pressures below atmospheric. My processes, as described in this specification, can all be performed in a closed chamber. Such a chamber process eliminates the need for clean rooms and the risk of exposing human operators to toxic liquids and vapors that are used in the conventional wet photoresist processes.

PDPP Film Resist Adaptability to Photo-oxidation at Longer Wavelengths

I also investigated whether PDPP films produced by my process were photosensitive further into the visible region of the electromagnetic spectrum. Prior art for plasma-deposited photosensitive films from single component reactants teaches that such films are only sensitive in the deep ultraviolet end of the spectrum. While this is ideal for high resolution device geometries, that is, under 0.5 μm, there is significant potential application for photoresists that are sensitive at longer wavelengths. These resists would require less expensive lithographic exposure tools. Furthermore, the ability to alter the level of photosensitivity of a resist is desirable for increased processing latitude. Alterable photosensitivity is also desirable for applications requiring photosensitivity further into the visible spectrum, or out of the visible spectrum for higher resolution pattern replication.

I experimented with a single three-inch silicon wafer prepared by the above monosilane/ethylene or toluene film depositions to determine PDPP and GLPDPP stoichiometry. The wafer was quartered. One quarter was exposed to 621 mj/sq-cm with light at 365 nm wavelength; one quarter was exposed to 621 mj/sq-cm with light at 254 nm wavelength.

An elemental analysis was performed on portions of the two exposed samples and one of the unexposed samples. The results are shown in Table 6, which indicates a 1:7 atom ratio of silicon to carbon for the unexposed photosensitive film.

TABLE 6

Elemental Analysis for Unexposed and Exposed Samples

| Sample Type | Carbon (%) | Oxygen (%) | Fluorine (%) | Silicon (%) |
|---|---|---|---|---|
| Unexposed | 77 | 10 | 2.3 | 11 |
| Exposed to light at 365 nm wavelength | 74 | 16 | 0 | 9.7 |
| Exposed to light at 254 nm wavelength | 67 | 22 | 2.2 | 9.2 |

Portions of both exposed pieces, and one of the quartered unexposed pieces, were submitted to Electron Spectroscopy for Chemical Analysis (ESCA). The ESCA analysis of the binding energies for the exposed and unexposed samples provided the results indicated in Tables 7A, 7B and 7C.

TABLE 7A

ESCA Binding Energy Data for Unexposed PDPP Samples

| Peak Assignments | C—R | C—OR | O=C—OR | C→C* | C=O,Si—O | C—F | R—Si | (RSi—O)$_n$ | SiO$_x$ ($1 \leq x \leq 2$) |
|---|---|---|---|---|---|---|---|---|---|
| Binding Energy eV | 284.6 | 285.6 | 288.4 | 291.0 | 532.6 | 689.6 | 100.4 | 102.0 | 102.8 |
| Unexposed (Atom Percent) | 71 | 3.9 | 0.0 | 2.0 | 10 | 2.3 | 5.8 | 5.2 | 0.0 |

TABLE 7B

ESCA Binding Energy Data for Exposed PDPP Samples at 365 nm

| Peak Assignments | C—R | C—OR | O=C—OR | C→C* | C=O,Si—O | C—F | R—Si | (RSi—O)$_n$ | SiO$_x$ ($1 \leq x \leq 2$) |
|---|---|---|---|---|---|---|---|---|---|
| Binding Energy eV | 284.6 | 285.6 | 288.4 | 291.0 | 532.6 | 689.6 | 100.4 | 102.0 | 102.8 |
| Exposed to light at 365 nm wavelength (Atom Percent) | 68 | 4.9 | 0.0 | 1.2 | 16 | 0.0 | 3.1 | 6.6 | 0.0 |

TABLE 7C

ESCA Binding Energy Data for Exposed PDPP Samples at 254 nm

| Peak Assignments | C—R | C—OR | O=C—OR | C→C* | C=O,Si—O | C—F | R—Si | (RSi—O)$_n$ | SiO$_x$ ($1 \leq x \leq 2$) |
|---|---|---|---|---|---|---|---|---|---|
| Binding Energy eV | 284.6 | 285.6 | 288.4 | 291.0 | 532.6 | 689.6 | 100.4 | 102.0 | 102.8 |
| Exposed to light at 254 nm wavelength (Atom Percent) | 56 | 8.6 | 1.6 | 0.6 | 22 | 2.2 | 0.0 | 3.7 | 5.5 |

The bonding information is drawn from high resolution scans of the elemental data and was used to examine the nature of the oxygen bonding as well. Atomic percentages are calculated for the included elements and do not include hydrogen, of which a considerable amount is expected to be present. The ESCA analysis represents approximately 100 Å of the surface of the material.

The ESCA analysis indicates photo-oxidation with light at 254 nm wavelength by increased binding of oxygen at that wavelength when compared to the unexposed sample. The analysis also shows photo-oxidation with light at 365 nm wavelength not as prominent as that with light at 254 nm wavelength. As expected, the incorporation of bound oxygen into the exposed films causes a proportionate reduction in the amount of carbon and silicon present. The binding energy data, from the high resolution scans, provides more insight into the photoreaction at the two frequencies. Peaks which show little significance or are felt to be attributable to contamination include the 689.6 eV bonds. However, significant trends did develop for the other represented bonds. Significantly, C—C, C—C*, C—H, Si—C, and Si—H bonds showed decreases with exposure. Furthermore, C—OC, C—OH, C=O, Si—O bonds showed consistent increases with exposure to light at 365 and 254 nm wavelengths. It is also noted that with the exposure to light at 254 nm wavelength, all of the silicon present was bonded to oxygen in some form with no remaining Si—C or Si—H bonds present. The 288.4 eV bond assigned to O=C—OC and O=C—OH are also present with the material exposed to light at 254 nm wavelength, but not at 365 nm wavelength. The binding energies assigned to C—R and R—Si are the correct energies to be predominantly hydrogen bonds. Therefore, substantially no Si—C bonding is apparent from the analysis for either the unexposed or exposed states. The lack of substantial silicon to carbon bonding is indicative of a film that is not a copolymer of silicon and a hydrocarbon but comprises (Si—H) and (Si—Si) low molecular weight fragments interstitially situated within a substantially organic polymer matrix that does not contain an appreciable amount of silicon and does not exhibit highly photosensitive behavior.

Not only is little or no Si—C bonding present, but etch characteristics indicate that the predominant driver of post exposure characteristics is the oxides of silicon formed and not any incidental oxidation of carbon and hydrogen.

The results of my experimentation show that satisfactory photoreactivity was demonstrated with light at 254 nm and 365 nm wavelengths. Subsequent etching in a buffered oxide etch exhibited satisfactory selective etching for samples exposed to both wavelengths.

PDPP Film Resist in the Fabrication of Heat Sensitive Solid-State Devices

The PDPP in my process is plasma-deposited film on a substrate and further processed without the need for heating the substrate. As previously stated, a particular type of substrate may be heated to enhance film depositing for a particular substrate, but heating of the substrate is not generally required. Conventional spun-on liquid photoresist requires one or more heating (by baking) steps of the photoresist/substrate material to polymerize and harden the photoresist for use as an etch mask after exposure to ultraviolet light. Therefore, substrates which undergo unfavorable property changes with the application of heat can successfully use my process where conventional resist processing with heat would degrade the substrate. For example, Gallium Arsenide (GaAs) is a common substrate for high frequency solid-state devices. When a GaAs substrate is heated, arsenic is driven off and the substrate material is degraded. Mercury-Cadmium-Telluride (HgCdTe) is a common substrate for use in making infrared detectors. When a HgCdTe is heated, mercury is driven off and the substrate is destroyed. Other classes of substrate material that are negatively effected by subjecting to heat are superconductor materials and glass. Substrate materials which are degraded by low levels of heating, such as organic plastics, can be successfully patterned microlithographically by using my PDPP film process.

PDPP Film Resist for Mercury-Cadmium-Telluride Substrates

The processing of Mercury-Cadmium-Telluride (HgCdTe) substrates is substantially different than that for the manufacture of other solid-state devices based on materials such as silicon. The proscribed etch for deposited HgCdTe is with an electron cyclotron resonant (ECR) etcher using argon, hydrogen and methane (Ar/H/CH$_4$). The ECR etcher used for the following processes was supplied by PlasmaQuest (Richardson, Tex.).

Samples of PDPP were prepared at thicknesses of 0.25, 0.50, and 0.75 μm and exposed to the ECR etch. The process recipe used in the etch chamber was performed using an etch recipe that is used for standard processing with an Ar/H/CH$_4$ plasma. The process parameters are shown in Table 8.

TABLE 8

Process Parameters for Ar/H/CH$_4$ Etching of HgCdTe

| Parameter | Setting |
|---|---|
| Upstream Conditions of the ECR Cavity | 4.64% H$_2$ in Ar, with flow rate of 100 sccm/min |
| Downstream Conditions of the ECR Cavity | 10.2% CH$_4$ in Ar with flow rate of 20 sccm/min |
| Chamber Pressure | 10 mtorr |
| Chuck Temperature | 17° C. |
| Upper Magnet Current | 125 A |
| Lower Magnet Current | 125 A |
| Microwave Input Power | 600 W |
| RF Input Power | 20 W |
| DC Bias | −8 V |

This etch recipe is what would be used to etch HgCdTe when used with conventional photoresist. However, conventional photoresist is approximately 25 times thicker than GLPDPP. One skilled in the art can adjust the etch recipe to optimize the etch process for the GLPDPP. Etch selectivities between 6.2:1 (HgCdTe:GLPDPP) and 9.3:1 were achieved.

With a process recipe that removes HgCdTe at the rate of 2800 Å/min, three different samples of GLPDPP were etched in ten minutes with the results indicated in Table 9.

TABLE 9

GLPDPP Etch Rate and Selectivity to HgCdTe

| Sample Number | Amount Removed after 10 minutes (Å) | Etch Rate (Å/min) | Selectivity (HgCdTe: GLPDPP) |
|---|---|---|---|
| 1 | 3015 ± 4 | 301.5 | 9.3:1 |
| 2 | 3945 ± 161 | 394.5 | 7.1:1 |
| 3 | 4551 ± 97 | 455.1 | 6.2:1 |

The results of these processes is that even a not fully oxidized layer of PDPP can be successfully used as a resist in HgCdTe solid-state processing. The ten minutes used for the test indicates that 3,000 to 4,000 Å of GLPDPP is capable of withstanding an etch sufficient to remove 28,000 Å, or 2.8 μm, of HgCdTe. While the total film was not fully photo-oxidized to GLPDPP, results of the test indicates GLPDPP can be used as a mask for the production etching of HgCdTe substrates.

PDPP Film Resist in the Fabrication of Flat Panel Displays

In fabrication of a flat panel display color filter, I can use a substrate that will readily accept organic dyes, such as polymethymethacrylate (PMMA). The PMMA is coated with a PDPP film via the process disclosed in this specification. The PDPP is exposed to form a GLPDPP matrix with small circular PDPP islands. The PDPP is removed with chlorine based chemistry, leaving a series of small circular windows in the GLPDPP. A production process is performed by placing the substrate/film in a solution containing an organic dye, and the solution will only be able to access the PMMA substrate where the small circular windows in the GLPDPP are. The GLPDPP will effectively resist the ingress of the dye solution. After the desired dyeing takes place, the substrate/film is removed from the solution and the GLPDPP is removed with a fluorine based chemistry, such as a 10:1 BOE, which will not effect the PMMA. After removal of the GLPDPP, there remains a series of dyed dots in the PMMA. I can repeat this process so that I have one PMMA substrate, with selectively dyed areas of red, green and blue. I can place a liquid crystal substrate behind the PMMA colored substrate to act as a light valve. Combined with a light source for back lighting of the PMMA substrate through the controlled liquid crystal substrate, I can use my PDPP film process to produce an inexpensive flat panel display. Since photoresist processes are used in the fabrication of the liquid crystal substrate, my PDPP film process can be used in their manufacture.

In summary, I have discovered a process of producing a plasma-deposited photo-oxidizable organosilicon film product by reacting a silicon donor with an organic precursor. I further processed the film product and discovered that I could selectively etch photo-oxidized and non-photo-oxidized areas of the film which led to one use of it as a resist material in the fabrication of solid-state devices. Furthermore, I discovered that due to the flexibility of my two component process, I could use a wider frequency range of light than that used with conventional resists to photo-oxidize the film. Since my process does not require the application or processing of a wet photoresist, my process allows fabrication of solid-state devices in an enclosed chamber. Since my filming process does not require heat, it may be used to process heat sensitive substrates.

PDPP Film as Selective Wetting Agent

In the process of using wet etching chemistry on the PDPP film, I discovered that the exposed, photo-oxidized areas (GLPDPP) easily wet with a liquid such as the 10:1 BOE. Whereas the unexposed PDPP areas do not wet. This process of selective GLPDPP wetting is used to selectively deposit materials with wet chemistry. The exposed area will wet and allow the selective deposition, most commonly a metal, such as silver or copper, while the unexposed areas are later removed with either organic solvent or a dry etch method.

Homogeneous chemical reduction can be used to deposit a thin metal film, for example, a thin film of silver, copper, nickel, gold and lead sulfide. A solution of metal ions is mixed with reducing agents to reduce the ions to metal in a homogeneous plating bath. The immersion of a film, with a photosensitized pattern of PDPP areas and GLPDPP areas, into this bath results in selective wetting and metal deposition only on the GLPDPP areas.

When a printed circuit board is produced, a metal film is deposited on an insulating board, which is usually organic material. The metal is then etched leaving the desired circuit. With the use of my PDPP films, the circuit could be selectively deposited from a mask of exposed GLPDPP. This will allow a much finer geometry, as well as a more cost effective additive process, rather than the costly process of blanket depositing and then etching off the unwanted material. Since the conductive metal trace must be supported on an insulator, the remaining GLPDPP under the metal serves as an excellent substrate electrical insulator.

Another application of my selective wetting process is in making photomasks. In this application, the PDPP film is deposited on an optically transparent substrate, usually quartz. The PDPP film on the quartz substrate is selectively exposed, leaving exposed (GLPDPP) and unexposed (PDPP) areas, and then the substrate with film is submerged in a metal plating solution. The metal will only deposit over the GLPDPP. Upon removal from the solution, the metal pattern resists the transmission of light, while the unexposed PDPP film can be etched away to form an inexpensive photomask.

It will be evident to those skilled in the art, that the process of selective wetting of a PDPP/GLPDPP film can be used for many useful purposes beyond those set forth in this specification.

In this disclosure, there is described preferred embodiments of the invention, it is to be understood that the invention is capable of use in other combinations and environments and is capable of changes or modifications within the scope of the inventive concept as expressed herein. Therefore, the present invention should not be limited to any single embodiment, but rather construed in breadth and scope in accordance with the recitation of the appended claims.

I claim:

1. A process for forming a film product comprising the steps of:
    forming a plasma deposited layer of photosensitive film on a substrate from a two component reaction of a silicon donor selected from the group consisting of monosilane and disilane, and a non-silicon containing, non-oxygenated organic precursor, wherein the film comprises photosensitive (Si—H) and (Si—Si) fragments interstitially situated in a non-silicon containing and non-photosensitive organic polymer matrix; and
    exposing selected areas of the film to ultraviolet light in the presence of oxygen, whereby the selected areas of the film are photo-oxidized to form a photo-oxidized film in the selected areas.

2. The process according to claim 1 wherein the organic precursor is ethylene or toluene.

3. The process according to claim 2 wherein the ratio of silicon atoms to carbon atoms in the layer of photosensitive film is approximately 1:7.

4. The process according to claim 1 wherein the organic precursor is ethylene or toluene and the silicon donor is monosilane with a weight ratio of the organic precursor to the silicon donor of approximately between 1:2 and 1:1.

5. The process according to claim 1 wherein the organic precursor is selected from the group consisting of alkanes, alkenes, alkynes, phenyls and aromatic hydrocarbons.

6. A process for fabricating a film product comprising the steps of:

placing a substrate in a plasma chamber;

evacuating air from the chamber;

forming a plasma generated photosensitive film on the surface of the substrate from a plasma reaction of two components comprising a silicon donor selected from the group consisting of monosilane and disilane, and a non-silicon containing, non-oxygenated organic precursor;

patterning the film by exposing the film with radiated electromagnetic energy through a mask in the presence of oxygen, whereby selected areas of the film are photo-oxidized to form a photo-oxidized film in the selected areas and unselected areas are remaining photosensitive film; and removing by selective etching either all of the selected areas of the film or the unselected areas of the film.

7. The process according to claim 6 wherein the organic precursor is selected from the group consisting of alkanes, alkenes, alkynes, phenyls and aromatic hydrocarbons.

8. The process according to claim 6 wherein the organic precursor is ethylene or toluene and the ratio of silicon atoms to carbon atoms in the photosensitive film is approximately 1:7.

9. The process according to claim 8 wherein the weight ratio of the organic precursor to the silicon donor is approximately between 1:2 and 1:1.

10. The process according to claim 6 wherein the step of removing by selective etching is accomplished with a buffered oxide etch having an etching selectivity of the photo-oxidized film over the remaining photosensitive film of greater than 25:1.

11. The process according to claim 6 wherein the step of removing by selective etching is accomplished with a chlorine plasma dry etch having an etching selectivity of the remaining photosensitive film over the photo-oxidized film of greater than 15:1.

12. The process according to claim 6 wherein the radiated electromagnetic energy is ultraviolet light.

13. A process for fabricating a film product comprising the steps of:

placing a substrate in a plasma chamber;

evacuating air from the chamber;

forming a plasma generated photosensitive film on the substrate from a plasma reaction of monosilane and an organic precursor selected from the group consisting of ethylene and toluene;

patterning the film by exposing the film with radiated electromagnetic energy through a mask in the presence of oxygen, whereby selected areas of the film are photo-oxidized to form a photo-oxidized film in the selected areas and unselected areas are the remaining photosensitive film; and removing by selective etching either all of the selected areas of the film or the unselected areas of the film.

14. The process according to claim 13 wherein the weight ratio of the organic precursor to the monosilane is approximately between 1:2 and 1:1 and the ratio of silicon atoms to carbon atoms in the layer of photosensitive film is approximately 1:7.

15. The process according to claim 13 wherein the step of removing by selective etching is accomplished with a buffered oxide etch having an etching selectivity of the photo-oxidized film over the remaining photosensitive film of greater than 25:1.

16. The process according to claim 13 wherein the step of removing by selective etching is accomplished with a chlorine plasma dry etch having an etching selectivity of the remaining photosensitive film over the photo-oxidized film of greater than 15:1.

17. The process according to claim 13 wherein the radiated electromagnetic energy is ultraviolet light.

* * * * *